US011674973B2

(12) United States Patent
Loeken

(10) Patent No.: US 11,674,973 B2
(45) Date of Patent: Jun. 13, 2023

(54) MAGNETIC-FIELD SENSOR DEVICE WITH A CONTROL UNIT WHICH ELECTRICALLY CONTROLS A SWITCHING ELEMENT

(71) Applicant: FRABA B.V., Heerlen (NL)

(72) Inventor: Michael Loeken, Juelich (DE)

(73) Assignee: FRABA B.V., SG Heerlen (NL)

( * ) Notice: Subject to any disclaimer, the term of this patent is extended or adjusted under 35 U.S.C. 154(b) by 52 days.

(21) Appl. No.: 17/428,282

(22) PCT Filed: Feb. 6, 2019

(86) PCT No.: PCT/EP2019/052908

§ 371 (c)(1),
(2) Date: Aug. 4, 2021

(87) PCT Pub. No.: WO2020/160766

PCT Pub. Date: Aug. 13, 2020

(65) Prior Publication Data

US 2022/0107336 A1 Apr. 7, 2022

(51) Int. Cl.
*G01P 3/481* (2006.01)
*G01R 33/02* (2006.01)

(52) U.S. Cl.
CPC ............ *G01P 3/4815* (2013.01); *G01R 33/02* (2013.01)

(58) Field of Classification Search
None
See application file for complete search history.

(56) References Cited

U.S. PATENT DOCUMENTS

| | | | |
|---|---|---|---|
| 6,084,400 | A | 7/2000 | Steinich et al. |
| 2016/0282424 | A1 | 9/2016 | Kawano et al. |
| 2018/0238714 | A1 | 8/2018 | Leidich et al. |
| 2018/0340800 | A1 | 11/2018 | Goto |

FOREIGN PATENT DOCUMENTS

| | | | | |
|---|---|---|---|---|
| DE | 199 25 884 | A1 | 12/2000 | |
| DE | 19925884 | A1 * | 12/2000 | ............ G01R 33/02 |
| DE | 199 25 884 | C2 | 9/2001 | |
| DE | 10 2004 013 022 | B3 | 10/2005 | |
| DE | 102004013022 | B3 * | 10/2005 | ............ G01D 5/147 |
| DE | 10 2012 008 888 | A1 | 10/2013 | |
| JP | 2003-315376 | A | 11/2003 | |
| JP | 2016-183903 | A | 10/2016 | |
| JP | 2017-530368 | A | 10/2017 | |
| JP | 2018-44859 | A | 3/2018 | |
| WO | WO 2017/126338 | A1 | 11/2018 | |

OTHER PUBLICATIONS

English Translation of DE-102004013022 (Year: 2005).*
English Translation of DE-19925884 (Year: 2000).*

* cited by examiner

*Primary Examiner* — Douglas X Rodriguez
(74) *Attorney, Agent, or Firm* — Norman B. Thot

(57) ABSTRACT

A magnetic-field sensor device includes at least two impulse wires, a coil assembly which radially surrounds the at least two impulse wires, the coil assembly defining a sensor element and a feedback element which generates an auxiliary magnetic field, an energy storage which is electrically connected to the coil assembly, a switching element which is electrically connected to the energy storage and to the feedback element, and a control unit which electrically controls the switching element.

21 Claims, 2 Drawing Sheets

10
22
26
24
28
20
30
14,15
16,17
12c
12a
13
18
12b

MAGNETIC-FIELD SENSOR DEVICE WITH A CONTROL UNIT WHICH ELECTRICALLY CONTROLS A SWITCHING ELEMENT

CROSS REFERENCE TO PRIOR APPLICATIONS

This application is a U.S. National Phase application under 35 U.S.C. § 371 of International Application No. PCT/EP2019/052908, filed on Feb. 6, 2019. The International Application was published in German on Aug. 13, 2020 as WO 2020/160766 A1 under PCT Article 21(2).

FIELD

The present invention relates to a magnetic-field sensor device comprising at least two impulse wires, a coil assembly radially surrounding the impulse wires, wherein the coil assembly constitutes a sensor element and a feedback element via which an auxiliary magnetic field can be generated, an energy store electrically connected to the coil assembly, and a switch element electrically connected to the energy store and to the feedback element.

BACKGROUND

Magnetic-field sensor devices are used in rotation angle measurement systems, for example, for detecting the rotation of a shaft. At least one permanent magnet is typically fastened to the shaft with the magnetic field of the permanent magnet being detected by the magnetic-field sensor device. For this purpose, the magnetic-field sensor device comprises at least one magnetically bistable impulse wire, which is also referred to as Wiegand wire, whose magnetization direction abruptly reverses due to the effect of an external magnetic field once a specific trigger field strength has been exceeded. In a sensor coil radially surrounding the impulse wire and constituting a sensor element of a coil assembly, a short voltage impulse is therefore generated which can be evaluated by a downstream electronic system. The electric energy of the generated voltage impulse can here at least partly be used for the energy supply of the magnetic-field sensor device. A reversal or turning-around of the magnetization direction of an impulse wire is hereinafter also referred to as "triggering" the impulse wire.

DE 199 25 884 C2 describes a magnetic-field sensor device which comprises a plurality of impulse wires. The plurality of impulse wires here generates sufficient energy in the coil assembly for enabling an energy-self-sufficient operation of the magnetic-field sensor device. No external energy supply therefore needs to be provided for the magnetic-field sensor device.

As a condition of manufacture, the plurality of impulse wires can have various triggering field strengths so that the impulse wires trigger at different local field strengths of the external magnetic field and thus at slightly different rotation angle positions of the shaft. This may result in at least one first impulse wire triggering at a defined rotation angle position of the shaft, while at least one second impulse wire does not trigger. As a result, the measuring results of the magnetic-field sensor device can be falsified and, in the case of a magnetic-field sensor device without an external energy supply, an insufficient amount of electric energy is generated for a proper operation of a downstream electronic system.

For ensuring that all impulse wires trigger once the triggering threshold of at least one impulse wire has been exceeded, the disclosed magnetic-field sensor device comprises an energy store, a coil assembly having a feedback element, and a switch element. The coil assembly can here comprise a separate feedback coil constituting the feedback element, or the feedback element can be constituted by the sensor coil. The electric energy generated in the sensor element of the coil assembly by a first impulse wire having a relatively low triggering threshold is buffered in the energy store. The stored energy is subsequently used for generating the auxiliary magnetic field in the feedback element of the coil assembly, which occurs at the same time as the external magnetic field and is rectified relative to the external magnetic field. The total magnetic field, i.e., the sum of the external magnetic field and the auxiliary magnetic field, here exceeds the triggering field strength of all remaining impulse wires. It is thereby ensured that all impulse wires of the magnetic-field sensor device trigger once the triggering threshold of at least one impulse wire has been exceeded.

DE 199 25 884 C2 describes that the switch element is preferably a simple capacitor which prevents the energy store from discharging via the feedback element of the coil assembly and, when a voltage impulse occurs in the sensor element of the coil assembly, enables a pulsed discharge of the energy store via the feedback element of the coil assembly. In such a configuration of the magnetic-field sensor device, each triggering of the first impulse wire causes a discharge of the energy store via the feedback element of the coil assembly and consequently a generation of the auxiliary magnetic field. This is independent of whether the remaining impulse wires have already been triggered by the external magnetic field or not. In the case that the external magnetic field has already caused all impulse wires to trigger, electric energy is unnecessarily consumed in the feedback coil and is thus no longer available for the energy supply of the magnetic-field sensor device.

SUMMARY

An aspect of the present invention is to provide a magnetic-field sensor device which does not require an external energy supply and which in particular operates in an energy-efficient manner.

In an embodiment, the present invention provides a magnetic-field sensor device which includes at least two impulse wires, a coil assembly which is arranged to radially surround the at least two impulse wires, the coil assembly defining a sensor element and a feedback element which is configured to generate an auxiliary magnetic field, an energy storage which is electrically connected to the coil assembly, a switching element which is electrically connected to the energy storage and to the feedback element, and a control unit which is configured to electrically control the switching element.

BRIEF DESCRIPTION OF THE DRAWINGS

The present invention is described in greater detail below on the basis of embodiments and of the drawings in which.

DETAILED DESCRIPTION

Figure 1:
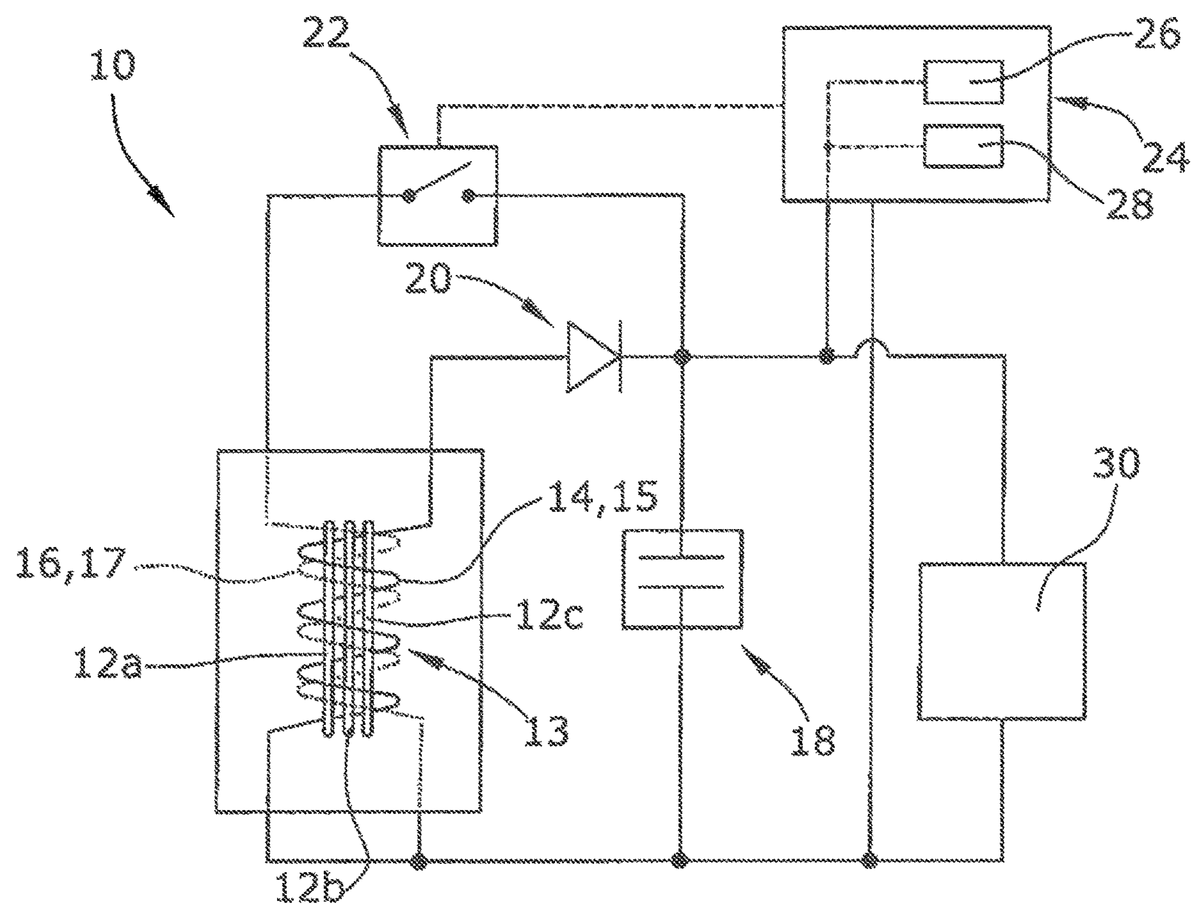
FIG. 1 shows a schematic diagram of a first exemplary embodiment of a magnetic-field sensor device according to the present invention, wherein the coil assembly comprises a sensor coil and a separate feedback coil.

The present invention provides a control unit for electrically controlling the switch element. The control unit enables a purposeful control of the switching state of the switch element and thus a purposeful generation of the auxiliary magnetic field as needed. The control unit can be provided as a separate assembly, but can alternatively also be integrated in an electronic assembly of the magnetic-field sensor device. The magnetic-field sensor device can, for example, comprise a digital circuit, such as a microcontroller or a so-called field programmable gate array (FPGA), which constitutes both an evaluation unit for detecting a rotation angle and the control unit. It is here conceivable that the control unit is provided as an algorithm and/or program programmed into the digital circuit.

The control unit can, for example, enable a purposeful generation of the auxiliary magnetic field depending on a total electric energy generated by the impulse wires in the sensor element of the coil assembly. The auxiliary magnetic field is here generated only when the electric energy generated in the coil assembly falls below a specific minimum energy value. The minimum energy value can here either be a fixedly predefined value or, alternatively, a variable value which can be adapted to the current energy requirement of the magnetic-field sensor device. The purposeful control of the switch element by the control unit in both cases provides that the auxiliary magnetic field is generated only when the external magnetic field is not sufficient for triggering all impulse wires. The energy required for generating the auxiliary magnetic field is thereby minimal so that the electric energy generated by triggering the impulse wires in the coil assembly is largely provided for the energy supply of the magnetic-field sensor device.

The control unit further enables an adaptation of the time of the generation of the auxiliary magnetic field for synchronization with the time profile of the external magnetic field. The auxiliary magnetic field can, for example, be purposefully generated at the time when the external magnetic field is at its maximum so that a relatively small auxiliary magnetic field is sufficient for triggering all impulse wires. The control unit in particular here, for example, enables a continuous adaptation of the time of generation of the auxiliary magnetic field depending on a current shaft rotational speed.

Due to provision of the control unit according to the present invention, the electric energy required for the generation of the auxiliary magnetic field is minimal and, consequently, the portion of the electric energy generated in the impulse wires and usable for the energy supply is also minimal. The magnetic-field sensor device according to the present invention does not therefore require an external energy supply and operates in a particularly energy-efficient manner.

In an embodiment of the present invention, the control unit can, for example, comprise a delay module. The delay module is directly or indirectly connected to the coil assembly so that the delay module is configured to be controlled by a voltage impulse in the sensor element of the coil assembly. The delay module is configured so that it provides a trigger signal when a predetermined delay time has elapsed when it is controlled by a voltage impulse in the sensor element of the coil assembly. The delay module enables a purposeful setting and/or adapting of the time when the switch element is controlled for generating the auxiliary magnetic field. The delay module can be completely made up of simple and inexpensive analogous components, such as resistors, capacitors and/or coils, wherein the delay time depends on the characteristics of the components used and their electric interconnection. The delay module can alternatively also be constituted by a digital circuit, for example, a microcontroller or a FPGA, wherein the delay time can, for example, be electronically set.

The control unit advantageously comprises a charging-state detection module which is adapted to detect a current charging state of the energy store. The charging-state detection module must here not necessarily be electrically connected to the energy store for detecting the charging state. The charging-state detection module can, for example, also detect an electric characteristic value which is directly proportional to the charging state of the energy store. The energy store charging state can, for example, be detected in a simple manner by evaluating the electric voltage existing at the energy store. The control unit is further configured for controlling the switch element depending on the charging state of the energy store detected by the charging-state detection module. Since the energy store charging state is dependent on the electric energy generated in the impulse wires and on the energy consumption of the magnetic-field sensor device, control of the switch element depending on the charging state enables a particularly efficient control of the generation of the auxiliary magnetic field and thus provides a particularly energy-efficient magnetic-field sensor device.

A time delay between the triggering times of the individual impulse wires can occur due to variations of the characteristics of the impulse wires attributable to the manufacture. According to a particularly advantageous embodiment of the present invention, the control unit is thus configured to trigger a detection of a charging state by the charging-state detection module in reaction to the trigger signal of the delay module. The detection of the charging state thus takes place with a defined time delay relative to the triggering time of the first impulse wire. The delayed detection of the charging state provides that, prior to the generation of the auxiliary magnetic field, the remaining impulse wires are not triggered by the external magnetic field. An unnecessary generation of the auxiliary magnetic field is thereby particularly reliably prevented and, consequently, an energy-efficient magnetic-field sensor device is created.

The control unit can, for example, be configured for controlling the switch element so that it generates the auxiliary magnetic field when a charging state below a charging-state threshold value is detected. The charging-state threshold value is here, for example, defined so that, as from the charging-state threshold value, the electric energy stored in the energy store is sufficient for providing a reliable operation of the magnetic-field sensor device. In this configuration, the auxiliary magnetic field, independent of whether all impulse wires have triggered or not, is generated only when the energy stored in the energy store is too low for providing the energy supply of the magnetic-field sensor system. For providing that all impulse wires always trigger, the charging-state threshold value can alternatively be defined so that it is not reached if all impulse wires have not triggered. A sensor signal with a relatively constant amplitude is thereby generated, whereby a particularly simple and reliable determination of the rotation angle is possible.

The coil assembly can, for example, comprise a single coil which radially surrounds the impulse wires and which constitutes both the sensor element and the feedback element. This provides for the realization of a particularly compact and inexpensive magnetic-field sensor device. In this configuration, as compared with a coil assembly having a sensor coil and a separate feedback coil, a higher electric voltage and thus more electric energy is further generated in the sensor element of the coil assembly when the impulse wires are triggered.

In an embodiment of the present invention, the energy store can, for example, be a simple and inexpensive capacitor.

The switch element can, for example, be a semiconductor switch which is inexpensive and which is easy electrically controlled by the control unit.

Two exemplary embodiments of a magnetic-field sensor device according to the present invention are described below on the basis of the accompanying drawings.

FIG. 1 shows a magnetic-field sensor device 10 having three impulse wires 12*a-c* which are radially surrounded by a coil assembly 13. The coil assembly 13 comprises a sensor coil 15 which constitutes a sensor element 14 and comprises a separate feedback coil 17 which constitutes a feedback element 16. The feedback coil 17 here has the same winding direction as the sensor coil 15. The three impulse wires 12*a-c* essentially extend parallel to each other. The three impulse wires 12*a-c* are made from a magnetically bistable material whose magnetization direction abruptly reverses due to the effect of an external magnetic field once the external magnetic field has exceeded a specific triggering field strength. Such impulse wires are also referred to as Wiegand wires. A reversal of the magnetization direction per impulse wire 12*a-c* here respectively induces an electrical voltage impulse in the sensor element 14.

An auxiliary magnetic field acting upon the impulse wires 12*a-c* can be generated due to energization of the feedback element 16. The auxiliary magnetic field is here rectified relative to the external magnetic field so that, upon energization of the feedback element 16, a total magnetization field acts upon the impulse wires 12*a-c*, which is stronger than the external magnetic field.

The magnetic field sensor device 10 further comprises an energy store 18 which, in the present exemplary embodiment, is constituted by a simple capacitor. A first connector of the energy store 18 is electrically connected to a first end of the sensor element 14, and a second connector of the energy store 18 is electrically connected to a second end of the sensor element 14 via a diode 20. The diode 20 is here arranged so that a current flow from the second end of the sensor element 14 towards the second connector of the energy store 18 is possible, but a reverse current flow from the second connector of the energy store 18 towards the second end of the sensor element 14 is blocked.

The diode 20 thus enables charging of the energy store 18 by the voltage impulses generated by the impulse wires 12*a-c* in the sensor unit 14, but prevents a discharging of the energy store 18 via the sensor element 14 when the sensor element 14 is voltage-free.

The magnetic-field sensor device 10 further comprises an electrically controllable switch element 22 and a control unit 24 for electrically controlling the switch element 22. In the present exemplary embodiment, the switch element 22 is a semiconductor switch, for example, a bipolar transistor or a field effect transistor. A first connector of the switch element 22 is electrically connected to the second connector of the energy store 18, and a second connector of the switch element 22 is electrically connected to the first end of the feedback element 16. The second end of the feedback element 16 is electrically connected to the first end of the energy store 18. A control connector of the switch element 22, via which the switching state of the switch element 22 and thus the current flow through the switch element 22 can be electrically controlled, is connected to the control unit 24. The energization of the feedback element 16 and thus the generation of the auxiliary magnetic field can consequently be electrically controlled via the control connector of the switch element 22.

The control unit 24 comprises a delay module 26 which is directly or indirectly connected to the sensor element 14 so that the delay module 26 is configured to be controlled by a voltage impulse in the sensor element 14. The delay module 26 is configured so that it provides a trigger signal to the control unit 24 when a defined delay time has elapsed. The trigger signal is thus provided in the sensor element 14 with a defined time delay to the voltage impulse. The delay time of the delay module 26 can here be electronically set by the control unit in the present exemplary embodiment.

The control unit 24 further comprises a charging-state detection module 28 via which a current charging state of the energy store 18 can be detected. In the present exemplary embodiment, the charging-state detection module 28 detects an electric voltage which is equal to or at least directly proportional to the electric voltage at the energy store 18, and determines the charging state of the energy store from the detected voltage. The detected charging state of the energy store is provided to the control unit 24.

In the present exemplary embodiment, the control unit 24 is configured so that, in reaction to the trigger signal of the delay unit 26, detection of the charging state of the energy store is triggered by the charging-state detection module 28. The detected charging state of the energy store is evaluated by the control unit 24. When the detected charging state of the energy store falls below a defined charging-state threshold value, the control unit 24 temporarily controls the switch element 22 for temporarily energizing the feedback element 16 and thereby generating the auxiliary magnetic field. In the present exemplary embodiment, the charging-state threshold value is adaptable, via the control unit 24, to a shaft rotation speed determined by a downstream electronic system 30 of the magnetic-field sensor device 10.

Figure 2:
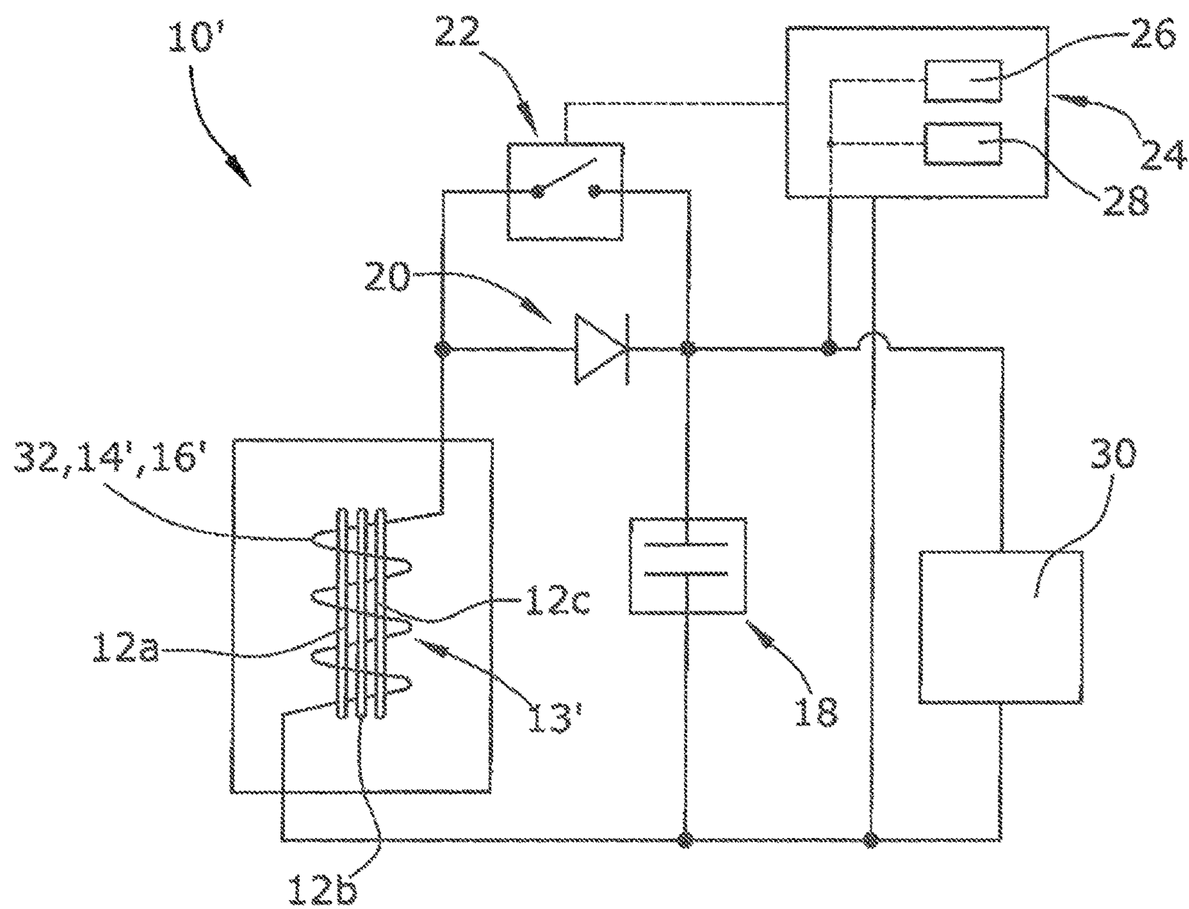
FIG. 2 shows a schematic diagram of a second exemplary embodiment of a magnetic-field sensor device according to the present invention, wherein the coil assembly comprises a single coil constituting both the sensor element and the feedback element.

FIG. 2 shows an alternative magnetic-field sensor device 10' according to the present invention. The magnetic-field sensor device 10' essentially differs from the magnetic-field sensor device 10 illustrated in FIG. 1 in that the coil assembly 13' comprises only a single multipurpose coil 32 which constitutes both the sensor element 14' and the feedback element 16'.

A first end of the multipurpose coil 32 is connected to the first end of the energy store 18. A second end of the multipurpose coil 32 is electrically connected to both the diode 20 and the switch element 22. The energy store 18 can be charged via the diode 20 by the voltage impulse generated upon triggering of the impulse wires in the multipurpose coil 32. The multipurpose coil 32 can further be energized by controlling the switch element 22 with the aid of the electric energy stored in the energy store 18 for generating the auxiliary magnetic field acting upon the impulse wires 12*a-c*.

It should be appreciated that the scope of protection of the present application is not limited to the described exemplary embodiments. The scope of protection is in particular not limited to the electric interconnection of the components illustrated in the exemplary embodiments. The magnetic-field sensor device according to the present invention can further comprise a different number of impulse wires. It is also conceivable that the control unit and the downstream electronic system are constituted by a single electric circuit. Reference should also be had to the appended claims.

LIST OF REFERENCE NUMERALS

10; 10' Magnetic-field sensor device
12*a-c* Impulse wires
13; 13' Coil assembly
14; 14' Sensor element
15 Sensor coil
16; 16' Feedback element
17 Feedback coil
18 Energy storage
20 Diode
22 Switching element
24 Control unit
26 Delay module
28 Charging-state detection module
30 Electronic system
32 Multipurpose coil

What is claimed is:

1. A magnetic-field sensor device comprising:
at least two impulse wires;
a coil assembly which is arranged to radially surround the at least two impulse wires, the coil assembly defining,
a sensor element, and
a feedback element which is configured to generate an auxiliary magnetic field;
an energy storage which is electrically connected to the coil assembly;
a switching element which is electrically connected to the energy storage and to the feedback element; and
a control unit which is configured to electrically control the switching element,
wherein,
the sensor element is configured to provide a voltage pulse, and
the control unit comprises a delay module which is configured to be controlled by the voltage pulse and to provide a trigger signal after a predetermined delay time.

2. The magnetic-field sensor device as recited in claim 1, wherein,
the control unit comprises a charging-state detection module which is configured to detect a present charging state of the energy storage, and
the control unit is further configured to control the switching element depending on the present charging state detected by the charging-state detection module.

3. The magnetic-field sensor device as recited in claim 2, wherein,
the control unit is further configured to control the switching element if the present charging state detected by the charging-state detection module is below a charging-state threshold value.

4. The magnetic-field sensor device as recited in claim 1, wherein,
the sensor element is configured to provide a voltage pulse,
the control unit comprises,
a delay module which is configured to be controlled by the voltage pulse and to provide a trigger signal after a predetermined delay time, and
a charging-state detection module which is configured to detect a present charging state of the energy storage, and
the control unit is further configured,
to control the switching element depending on the present charging state detected by the charging-state detection module, and
to trigger a charging state detection by the charging-state detection module in reaction to the trigger signal provided by the delay module.

5. The magnetic-field sensor device as recited in claim 1, wherein the coil assembly comprises a single coil which defines both the sensor element and the feedback element.

6. The magnetic-field sensor device as recited in claim 1, wherein the energy storage is a capacitor.

7. The magnetic-field sensor device as recited in claim 1, wherein the switching element is a semiconductor switch.

8. A magnetic-field sensor device comprising:
at least two impulse wires;
a coil assembly which is arranged to radially surround the at least two impulse wires, the coil assembly defining,
a sensor element, and
a feedback element which is configured to generate an auxiliary magnetic field;
an energy storage which is electrically connected to the coil assembly;
a switching element which is electrically connected to the energy storage and to the feedback element; and
a control unit which is configured to electrically control the switching element
wherein,
the control unit comprises a charging-state detection module which is configured to detect a present charging state of the energy storage, and
the control unit is further configured to control the switching element depending on the present charging state detected by the charging-state detection module.

9. The magnetic-field sensor device as recited in claim 8, wherein,
the sensor element is configured to provide a voltage pulse, and
the control unit comprises a delay module which is configured to be controlled by the voltage pulse and to provide a trigger signal after a predetermined delay time.

10. The magnetic-field sensor device as recited in claim 8, wherein,
the control unit is further configured to control the switching element if the present charging state detected by the charging-state detection module is below a charging-state threshold value.

11. The magnetic-field sensor device as recited in claim 8, wherein,
the sensor element is configured to provide a voltage pulse,
the control unit comprises,
a delay module which is configured to be controlled by the voltage pulse and to provide a trigger signal after a predetermined delay time, and
a charging-state detection module which is configured to detect a present charging state of the energy storage, and
the control unit is further configured,
to control the switching element depending on the present charging state detected by the charging-state detection module, and
to trigger a charging state detection by the charging-state detection module in reaction to the trigger signal provided by the delay module.

12. The magnetic-field sensor device as recited in claim 8, wherein the coil assembly comprises a single coil which defines both the sensor element and the feedback element.

13. The magnetic-field sensor device as recited in claim 8, wherein the energy storage is a capacitor.

14. The magnetic-field sensor device as recited in claim 8, wherein the switching element is a semiconductor switch.

15. A magnetic-field sensor device comprising:

at least two impulse wires;

a coil assembly which is arranged to radially surround the at least two impulse wires, the coil assembly defining, a sensor element, and a feedback element which is configured to generate an auxiliary magnetic field;

an energy storage which is electrically connected to the coil assembly;

a switching element which is electrically connected to the energy storage and to the feedback element; and a control unit which is configured to electrically control the switching element, wherein, the sensor element is configured to provide a voltage pulse, the control unit comprises, a delay module which is configured to be controlled by the voltage pulse and to provide a trigger signal after a predetermined delay time, and a charging-state detection module which is configured to detect a present charging state of the energy storage, and the control unit is further configured, to control the switching element depending on the present charging state detected by the charging-state detection module, and to trigger a charging state detection by the charging-state detection module in reaction to the trigger signal provided by the delay module.

16. The magnetic-field sensor device as recited in claim 15, wherein, the sensor element is configured to provide a voltage pulse, and the control unit comprises a delay module which is configured to be controlled by the voltage pulse and to provide a trigger signal after a predetermined delay time.

17. The magnetic-field sensor device as recited in claim 15, wherein, the control unit comprises a charging-state detection module which is configured to detect a present charging state of the energy storage, and the control unit is further configured to control the switching element depending on the present charging state detected by the charging-state detection module.

18. The magnetic-field sensor device as recited in claim 17, wherein, the control unit is further configured to control the switching element if the present charging state detected by the charging-state detection module is below a charging-state threshold value.

19. The magnetic-field sensor device as recited in claim 15, wherein the coil assembly comprises a single coil which defines both the sensor element and the feedback element.

20. The magnetic-field sensor device as recited in claim 15, wherein the energy storage is a capacitor.

21. The magnetic-field sensor device as recited in claim 15, wherein the switching element is a semiconductor switch.

* * * * *